US005575529A

United States Patent [19]
Dowdy et al.

[11] Patent Number: 5,575,529
[45] Date of Patent: Nov. 19, 1996

[54] MODULE ENCLOSURE AND MODULE LATCH MECHANISM

[75] Inventors: James L. Dowdy, Eagle; Darrel W. Poulter, Middleton, both of Id.

[73] Assignee: Hewlett-Packard Company, Palo Alto, Calif.

[21] Appl. No.: 388,731

[22] Filed: Feb. 14, 1995

[51] Int. Cl.$^6$ .................................................. A47B 81/06
[52] U.S. Cl. ...................... 312/223.2; 312/333; 361/725
[58] Field of Search ............................. 312/223.1, 223.2, 312/333; 361/725, 726, 732, 740, 759, 747, 801

[56] References Cited

U.S. PATENT DOCUMENTS

| | | | |
|---|---|---|---|
| 4,798,923 | 1/1989 | Barwick et al. | 361/759 |
| 4,914,530 | 4/1990 | Iilsingen | 361/725 |
| 4,979,909 | 12/1990 | Andrews | 312/333 |
| 5,003,431 | 3/1991 | Imsdahl | 361/725 |
| 5,269,698 | 12/1993 | Singer | 361/726 |
| 5,359,489 | 10/1994 | Hass et al. | 361/732 |

*Primary Examiner*—Peter M. Cuomo
*Assistant Examiner*—Anthony D. Barfield

[57] ABSTRACT

Device modules of an electrical system are slidably fitted in an enclosure and integrated therein as a part of an air duct system for cooling the modules. Other modules such as air mover modules, for the air duct system, are also slidably fitted in the enclosure to move air in the air ducts and the device modules. Each module carries a pivotally mounted flat latch lever in a recess in a surface at one end of the module. A latch member on one end of the latch lever engages a catch member on the enclosure as the module approaches its fully inserted position. Movement of the latch lever to latched position, when the latch member and catch member are engaged, pivots the latch lever about the catch member and applies force to the module at the pivotal mount, to drive the module into its fully inserted position. The mechanical advantage provided by the latch lever minimizes the manually applied forces acting on the module which significantly reduces the likelihood of damaging any device within the module. Reverse pivotal movement of the latch lever about the catch member withdraws the module from its fully inserted position. The mechanical advantage provided by the latch lever minimizes the application of pushing and pulling manual force to the module for its insertion and removal into and out of the fully inserted position.

7 Claims, 5 Drawing Sheets

MODULE ENCLOSURE AND MODULE LATCH MECHANISM

CROSS REFERENCE TO RELATED APPLICATION

Application of Rudolph R. Rynders et al, entitled "Synchronized Lever Mechanism For Insertion And Removal Of Modules In Housings", filed Oct. 31, 1994, Ser. No. 08/331,452, assigned to the assignee of this invention. (PD 1094758).

TECHNICAL FIELD

This invention relates to module enclosures and in particular to such an enclosure in which leverage is employed to insert and to latch and to unlatch and to remove the module to and from a fully inserted position within the module enclosure.

BACKGROUND OF THE INVENTION

Modules which are mounted in a high packing density environment in an enclosure and which form part of an electrical system, require cooling. A typical example of such an enclosure is found in redundant arrays of inexpensive devices (RAID). Here, device modules, in which the device in each module is a disk drive, for example, are packed in enclosures which must be cooled.

The device modules are frequently slidably fitted into the enclosures. They each have a fixed handle to which push and pull forces are applied to insert and remove the module with respect to the enclosure. Disk drives in such modules are equipped with multi pin plug connectors which require high forces to engage and release. Uncontrolled acceleration forces during the connector engagement and disengagement process frequently cause damage to the drive by shifting the head relative to the disk. If the disk is rotating, as during removal of the disk drive module, the gyroscopic forces acting on the spinning disk assembly may cause minute precession displacement of the disks in the stack, causing head crashes, damaging the heads and the disks. In such a fixed handle design of the modules, a separate lock-in feature is required to prevent unwanted electrical disconnections resulting from forces in the environment of use.

SUMMARY OF THE INVENTION

Device modules of an electrical system are slidably fitted in an enclosure and integrated therein as a part of an air duct system for cooling the modules. Other modules such as air mover modules, for the air duct system, are also slidably fitted in the enclosure to move air in the air ducts and the device modules. Each module carries a pivotally mounted flat latch lever in a recess in a surface at one end of the module. A latch member on one end of the latch lever engages a catch member on the enclosure as the module approaches its fully inserted position. Movement of the latch lever to latched position, when the latch member and catch member are engaged, pivots the latch lever about the catch member and applies force to the module at the pivotal mount, to drive the module into its fully inserted position. The mechanical advantage provided by the latch lever minimizes the manually applied forces acting on the module which significantly reduces the likelihood of damaging any device within the module. Reverse pivotal movement of the latch lever about the catch member withdraws the module from its fully inserted position. The mechanical advantage provided by the latch lever minimizes the application of pushing and pulling manual force to the module for its insertion and removal into and out of the fully inserted position.

BRIEF DESCRIPTION OF THE DRAWINGS

The invention will be understood by reference to the following specification when considered in conjunction with the accompanying drawings, in which.

DESCRIPTION OF THE BEST MODE FOR PRACTICING THE INVENTION

Figure 1:
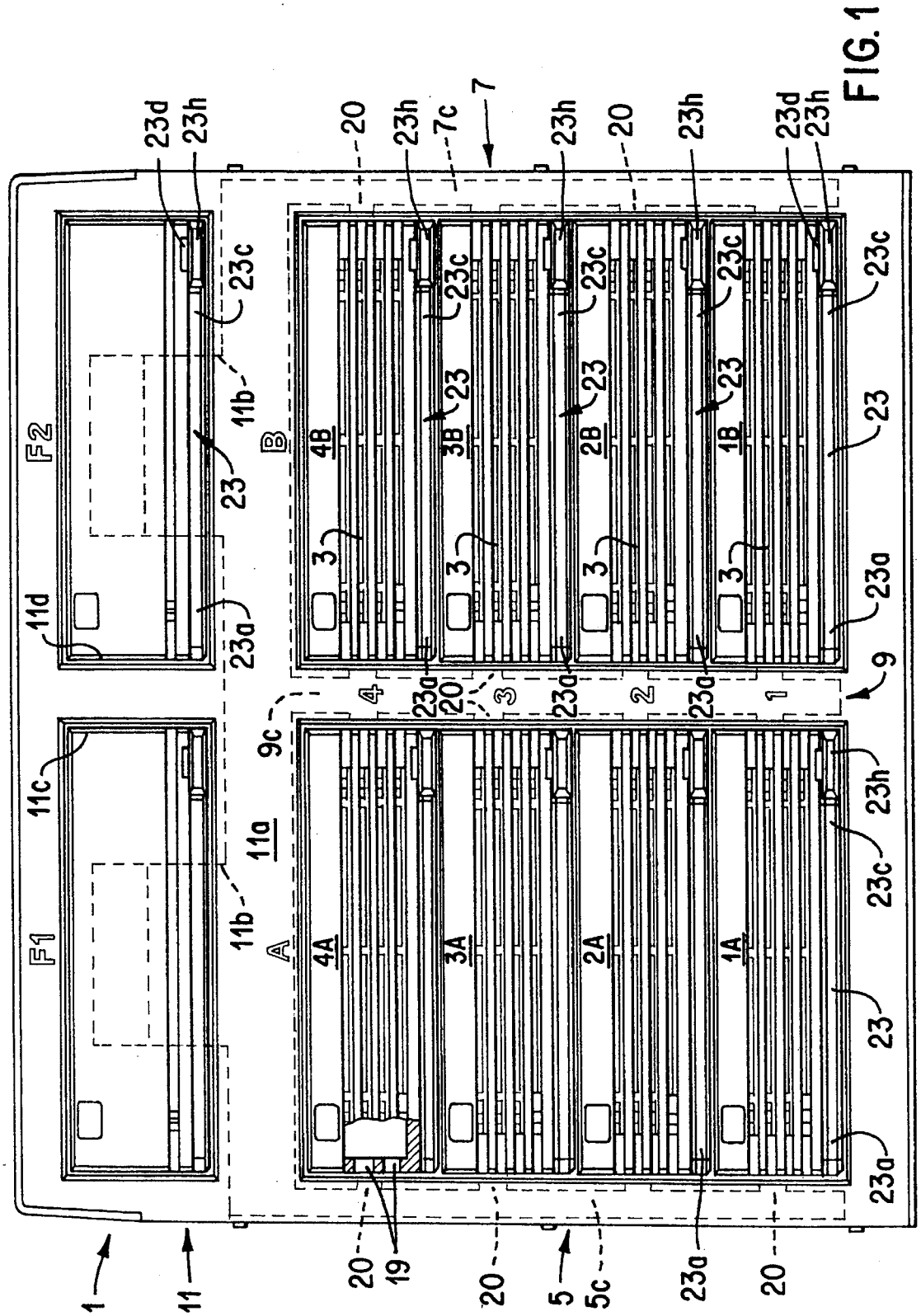
FIG. 1, is a front elevational view of an enclosure assembly which mounts device modules and air mover modules, each of which mounts a manually operated latch lever for moving and locking the module into a fully inserted position of the module and for unlocking and removing the module from its fully inserted position.
Figure 2:
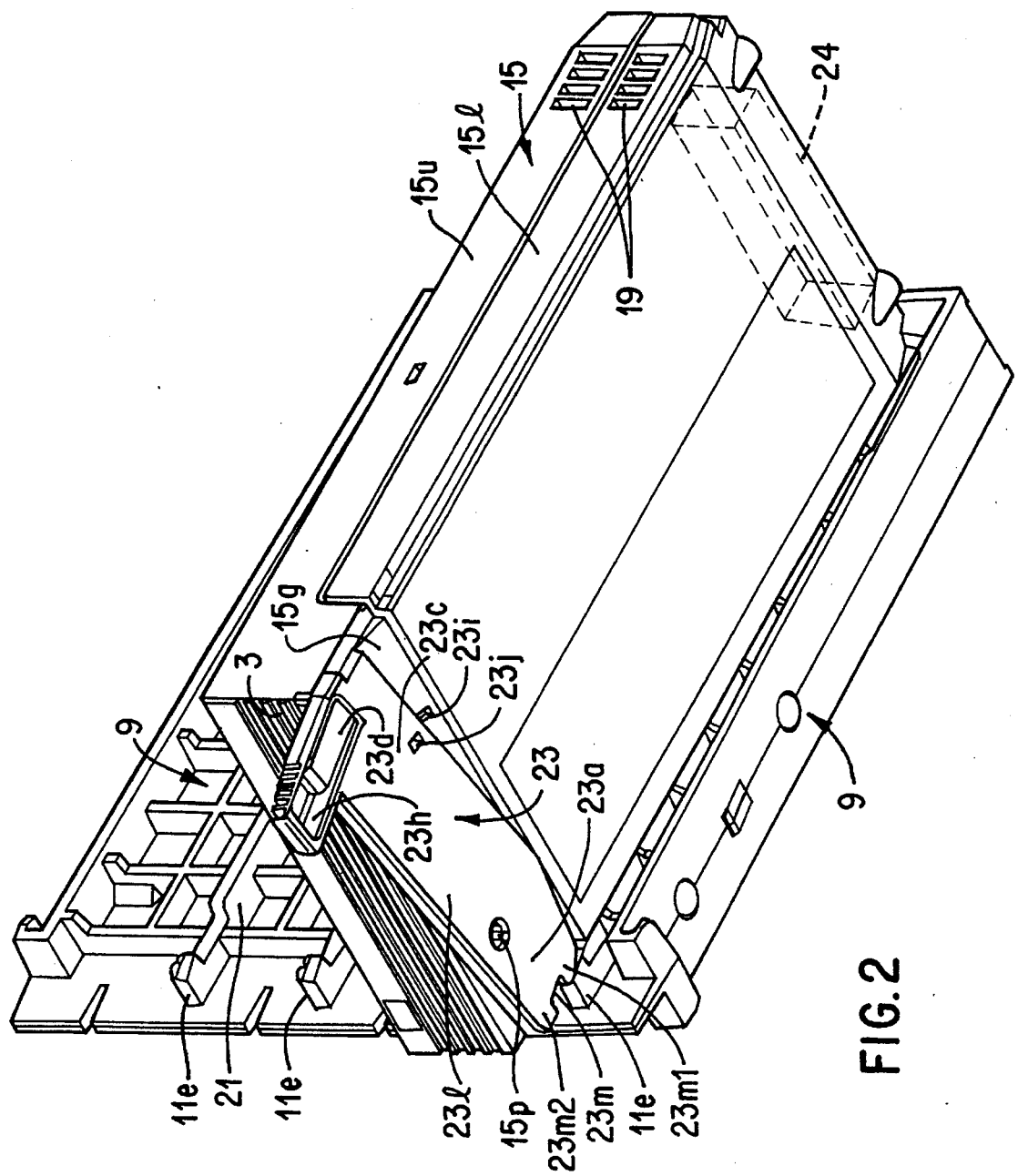
FIG. 2, is a fragmentary isometric view of a device module illustrated in a partially inserted position on one wall of the enclosure.
Figure 3:
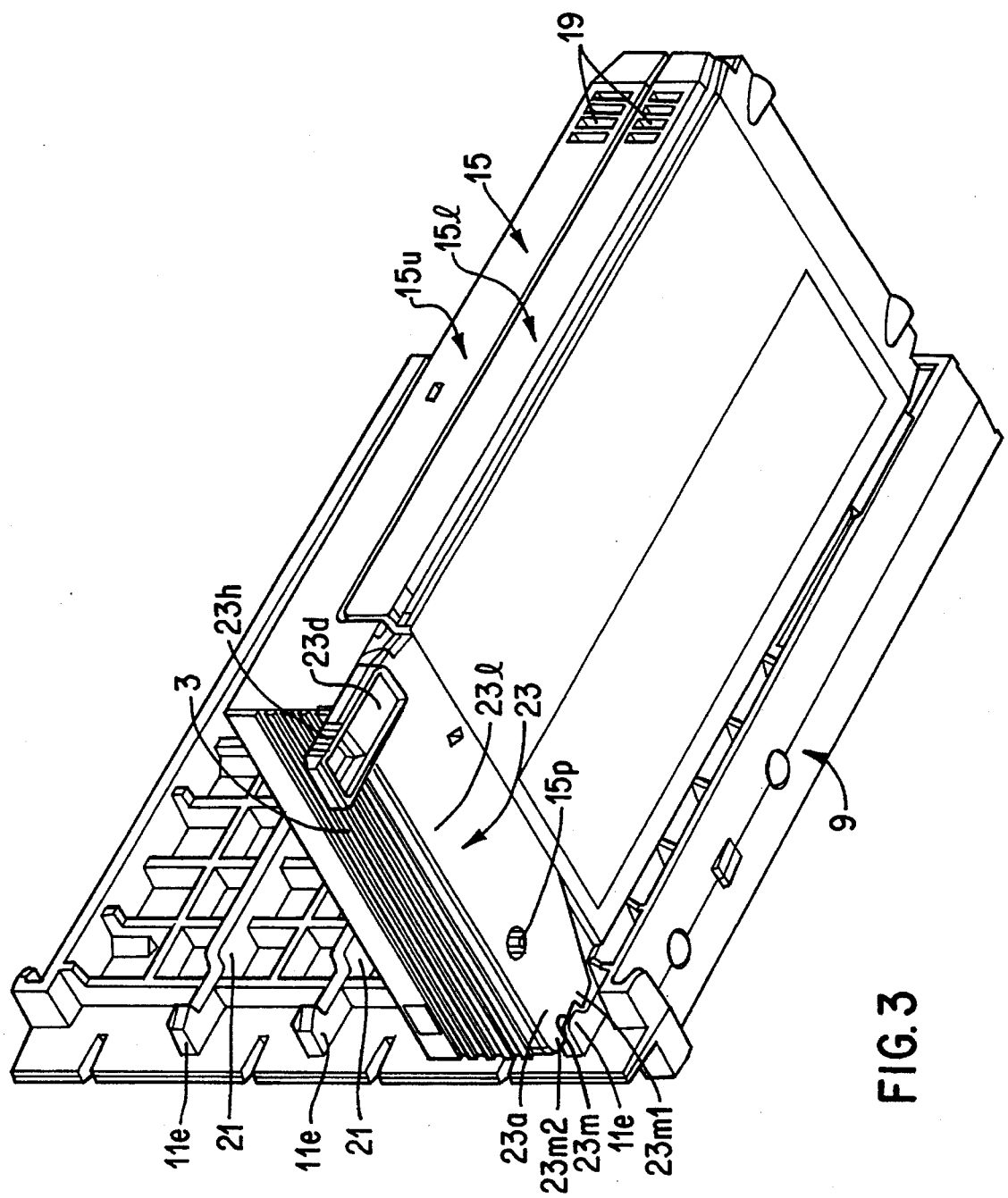
FIG. 3, is a fragmentary isometric view similar to FIG. 2 with the device module illustrated in a fully inserted position.

In FIG. 1, device modules 1A–4A, 1B–4B, forming part of an electrical system, are slidably fitted into an enclosure 1 and integrated therein as part of an air duct system for cooling the modules. As seen in FIGS. 1, 2 and 3, the modules are of rectangular configuration and may house electrical devices such as disk drives. As seen in FIG. 1, the device modules 1A–4A are slidably fitted into slots in the enclosure 1 defined between a side wall 5 and a central or common wall 9, and the device modules 1B–4B are slidably fitted into slots defined between a side wall 7 and the common wall 9.

An air duct system in the enclosure 1 comprises air ducts 5c, 7c and 9c, located in the enclosure walls 5, 7 and 9, respectively. Air passages couple these modules to these air ducts. The device module of 1A of FIGS. 2 and 3, represents all of the device modules. Each device module has an entrance air passage 3 at one end, the front end, comprising slots, and an exit air passage 19 at the opposite end, comprising two rows of four slots each, as seen in FIGS. 2 and 3. There is an exit air passage 19 on each side of the device module 1A. Returning to FIG. 1, as seen at device module 4A, representing all device modules, the exit air passages 19 are each aligned with a metered air passage 20 in the air ducts 5c, 7c and 9c.

The air pressure source comprises the air mover modules F1, F2 which in the best mode concept are centrifugal fans. These fans draw air from the enclosure 1 and exhaust it to the atmosphere. These centrifugal fans are coupled to the air plenum 11a via air passages 11b. When the fans F1, F2 are running, air pressure is reduced in the air duct system. Air now enters the air duct system via the entrance air passages 3 in the modules, travels through the modules which are coupled to the air ducts 5c, 7c, 9c via air passage 19 and the metered air passages 20 in the air ducts. These air ducts 5c, 7c and 9c open into the air plenum 11a at their upper ends. Air from the air ducts 5c, 7c and 9c passes through the air plenum 11a and the centrifugal fans F1, F2, and is exhausted to the atmosphere.

The device modules 1A–4A, 1B–4B, and the air mover modules F1, F2, are inserted into and removed from the enclosure 1 through openings at the front of the enclosure. Each module, when inserted, becomes a part of the air duct system. To minimize the magnitude of the manual force application required to connect and disconnect the electrical connectors, one part 24 is seen in FIG. 2, and further to secure the modules in fully inserted position, a latch lever operated locking mechanism 23 is carried by each of the modules. FIGS. 4–10 detail the latch lever mechanism 23.

As best seen in FIGS. 2 and 3, each module comprises a housing 15 which has an upper housing section 15u and a lower housing section 15l. The lower housing section 15l is provided with a recess 15g in its lower surface. The latch lever 23l of the latch mechanism 23 is pivotally mounted on a pivot shaft 15p in the recess 15g. The latch lever 23l has a latch end 23a and a handle end 23c. In this position, the outer surface of the latch lever 23l is flush with the bottom surface of the module, in which position the latch lever 23l clears a device module mounted therebelow.

Figure 5:
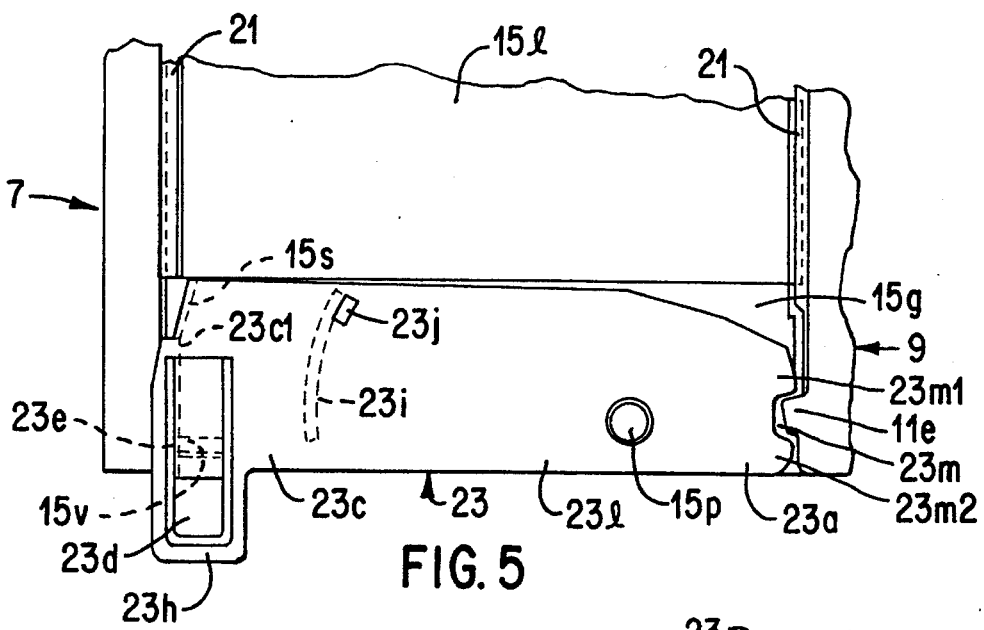
FIG. 5, is a view similar to FIG. 4, with the latch lever in latched position.

The latch end 23a of the latch lever 23l is provided with a notch 23m which in the latched position of the latch lever, engages a projection 11e on the common wall 9. An arcuate slot 23i in the recess 15g is engaged by an L-shaped slot follower 23j, FIGS. 5 and 7, on the lever arm 23l. The L-shaped slot follower 23j secures the lever 23 to prevent its displacement from the recess 15g during its operation. The L-shaped slot follower restricts the lever to angular movement in a plane. A handle 23h, on the handle end 23c of the latch lever 23l, provides a finger gripping attachment for angularly moving the latch lever 23l. A flexible cantilever latch member 23d has a latch 23e which engages a catch recess 15v in the recess 15g in the lower housing 15l of the module 15. As seen in FIG. 5, when the latch lever 23l is in latched position, the latch member 23e engages the catch notch 15v in the recess 15g.

Figure 4:
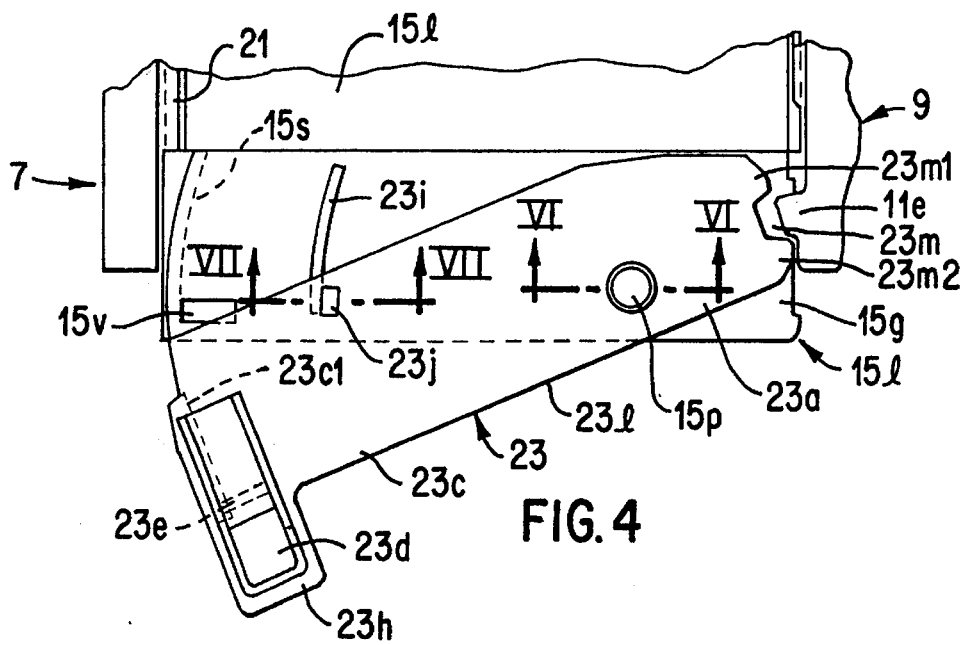
FIG. 4, is a plan view of a latch, viewed from its bottom side, with the latch lever in unlatched position.

In preparation for insertion of a module into a slot in the enclosure 1, the latch lever 23l is moved to unlatched position as seen, for example, in FIG. 4. In this position, the leading edge 23m1 of the notch 23m, of the latch lever 23l, clears the projection 11e in the common wall 9 of the enclosure 1. However, the trailing edge 23m2 of the notch 23m does not clear the projection 11e, and, as seen in FIG. 4, engages a projection 11e at the front end of a track 21 mounted to the common wall 9. With continuing insertion movement of the module, this engagement of the notch 23m and the projection 11e rotates the latch lever 23l in a clockwise direction. The leading edge 23m1 of the notch 23m now moves below the upper edge of the projection 11e and continuing pressure on the handle 23h, completes the insertion of the air mover module. Moving the latch lever 23l into latched position, as seen in FIGS. 3 and 5, completes the insertion of the module. At this point the latch projection 23e on the cantilever latch lever 23d is engaged in the notch 15v in the recess 15g, as seen in FIG. 5.

Figure 6:
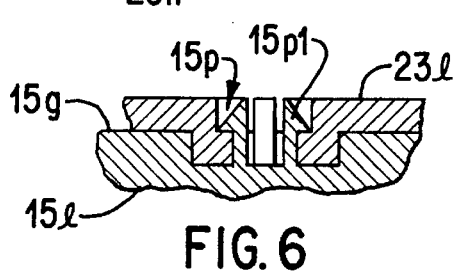
FIG. 6, is an enlarged sectional view in the section plane VI—VI of FIG. 4, illustrating the latch lever pivot shaft in cross section.
Figure 7:
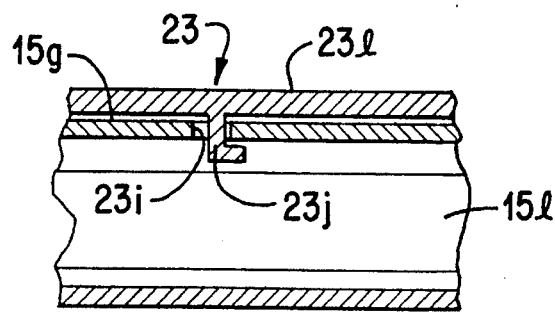
FIG. 7, is a cross sectional view taken in the section plane VII—VII of FIG. 4, showing the details of a slot follower.

The pivot shaft 15p for the latch lever 23l is illustrated in FIG. 6. This pivot shaft comprises four circumferentially spaced cantilever shaft sections each of which terminates in a barb 15p1. The hole in the latch lever has a shoulder. The latch lever 23l is attached to the pivot shaft 15p by passing the L-shaped latch follower 23j through the arcuate slot 23i with the latch lever in unlatched position, aligning the hole in the latch lever with the pivot shaft 15p and pressing the lever arm onto the pivot shaft. Engagement is completed when the shoulder in the hole in the latch lever passes beneath the barbs 15p1 of the pivot shaft 15p and the barbs snap over the shoulder.

Figure 8:
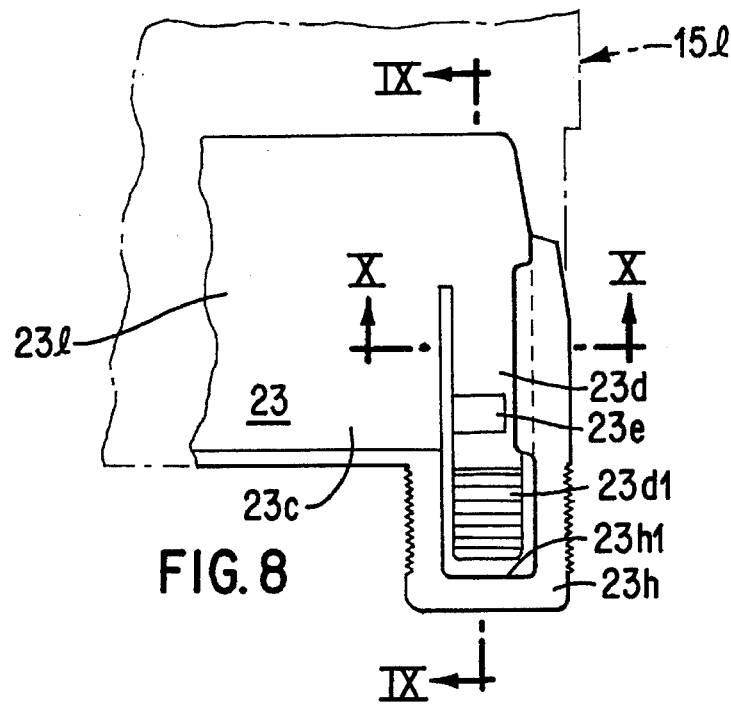
FIG. 8, is an enlarged plan view of the latch lever handle as viewed from the top side.
Figure 9:
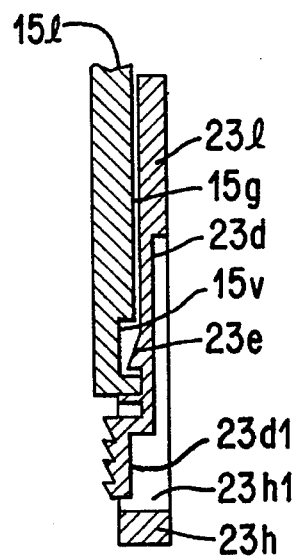
FIG. 9, is a cross section of the cantilever latch arm of the latch lever lock, taken in the section plane IX—IX of FIG. 8, and FIG. 10, is a cross section view taken in the section plane X—X of FIG. 8, illustrating a retaining lip on the handle end of the latch lever which prevents lateral displacement of the latch lever from either manually applied lever actuation forces or cantilever latch arm displacement forces.
Figure 10:
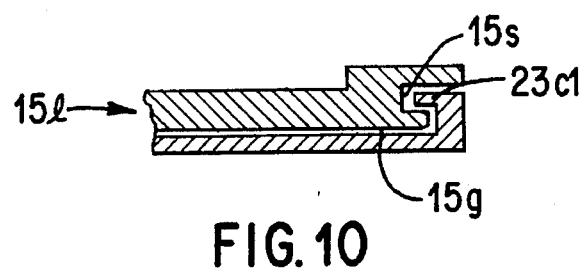

Details of the lock mechanism which locks the latch lever 23l in latched position appear in FIGS. 8–10. FIG. 8 is a fragmentary plan view of the top side of the handle end of the latch lever 23l. FIG. 9 illustrates the structure of the latch lever lock, showing the latch lever lock in locked position. The cantilever latch arm 23d has a distal end 23d1 in the form of a finger pad which is positioned within the opening 23h1 in the latch handle 23h. The latch 23e projects into the recess 15v in the recessed surface 15g of the lower module housing 15l.

When inserting and locking the module in the enclosure 1, it is only necessary to apply finger pressure to the handle 23h directed primarily in the plane of movement of the latch lever 23l. Module insertion and locking is completed when the latch member 23e snaps into the recess 15v in the module housing 15l.

Removal of the module is simply accomplished by gripping the handle 23h and pad 23d1 between the thumb and index finger, for example. This gripping of the handle 23h and pad 23d1 displaces the latch member 23e from the recess 15v. While in this thumb and index finger grip, pulling on the handle 23h leverages the module from fully inserted position, disconnecting any connections and freeing the module for easy withdrawal.

When the module is inserted to a position where the connector parts are approaching engagement, additional stabilization of the latch lever in the plane of movement is provided, as seen in FIG. 10, in the provision of a peripheral slot 15s in the edge of the recessed section 15g of the lower housing section 15l. A lip 23c1 on the handle end of the latch lever 23l projects into this slot 15s, see also FIG. 4. As the latch lever rotates clockwise during module insertion, as seen in FIG. 4, the lip 23c1 enters the slot 15s. Engagement of the connector parts requires increased manual force on the handle 23h. If there is a downward component of manual force on the handle 23h, engagement of the lip 23c1 in the slot 15s prevents displacement of the latch lever from the plane of movement.

What is claimed is:

1. An enclosure assembly, comprising:

a. an enclosure having opposite side walls and an open end;

b. a module insertable through said open end of said enclosure said module having a front end and opposing sides wherein, when said module is fully inserted into said enclosure, said front end is positioned substantially at said open end of said enclosure and said sides are positioned within and extend along said walls of said enclosure, said module having a recess of predetermined depth in one surface thereof, the recess having a recess surface extending to said sides of said module at said front end of said module;

c. a latch lever operatively connected to the module, said latch lever being disposed between said walls of said enclosure at said front end of said module, said latch Lever having a latch end and a handle end, said latch lever having a predetermined thickness less than the depth of said recess and having an outer surface which is substantially flush with said one surface of said module;

d. pivot means mounted to said recess surface, pivotally engaging said latch lever between said latch end and said handle end, said latch lever being angularly movable in said recess about said pivot means between a latched position and an unlatched position;

e. said recess surface having an arcuate slot therethrough at a radius from said pivot means to a position near said handle end of said latch lever;

f. a slot follower mounted to said latch lever and projecting through said arcuate slot for preventing bending of said latch lever away from said recess surface;

g. a catch member on said enclosure;

h. a latch member on said latch end of said latch lever for engaging said catch member; and i. said latch member, when said latch lever is in said latched position, passing by said catch member as said module is moved toward said fully inserted position in said enclosure, movement of said latch lever toward and into latched position is by the application of manual force to said latch lever at said handle end to engage said latch member with said catch member and move said module, by force application thereto at said pivot means, to said fully inserted position in said enclosure.

2. The enclosure assembly according to claim 1, in which:

a. said catch member is a projecting catch member mounted to said enclosure;

b. said latch member is a notched latch member on said latch end of said latch lever for receiving said projecting catch member, said notched latch member comprising a leading part and a trailing part spaced from said leading part defining a notch therebetween;

c. said leading part, when said latch lever is in said unlatched position, passing said projecting catch member as said module is moved toward said fully inserted position in said enclosure, said trailing part of said notched latch member engaging said projecting catch member and rotating said latch lever in a direction toward latched position to move said leading part of said notched latch member in a direction to engage said projecting catch member in said notch of said notched latch member, movement of said latch lever toward and into latched position by the application of force to said latch lever at said handle end further engaging said latch member with said projecting catch member in said notch and moving said module, by force application thereto at said pivot means, to said fully inserted position in said enclosure.

3. The enclosure assembly according to claim 1, in which:

a. said latch lever being pivotally mounted in said recess and being locked in said arcuate slot to prevent bending, is limited to angular movement in a plane in said recess, between latched and unlatched positions, substantially paralleling said one surface of said module.

4. An enclosure assembly, comprising a. an enclosure having opposite side walls and an open end;

b. a module insertable through said open end of said enclosure, said module having a front end and opposing sides wherein, when said module is fully inserted into said enclosure, said front end is positioned substantially at said open end of said enclosure and said sides are positioned within and extend along said walls of said enclosure, said module having a recess of predetermined depth in one surface thereof, the recess having a recess surface extending to said sides of said module at said front end of said module;

c. a latch lever operatively connected to the module, said latch lever being disposed between said walls of said enclosure at said front end of said module, said latch lever having a latch end and a handle end, said latch lever having a predetermined thickness less than the depth of said recess and having an outer surface which is substantially flush with said one surface of said module;

d. pivot means mounted to said recess surface, pivotally engaging said latch lever between said latch end and said handle end, said latch lever being angularly movable in said recess about said pivot means between a latched position and an unlatched position;

e. said recess surface having an arcuate slot therethrough at a radius from said pivot means to a position near said handle end of said latch lever;

f. a slot follower mounted to said latch lever and projecting through said arcuate slot for preventing bending of said latch lever away from said recess surface;

g. a catch member on said enclosure;

h. a latch member on said latch end of said latch lever for engaging said catch member;

i. said latch member, when said latch lever is in said latched position, passing by said catch member as said module is moved toward said fully inserted position in said enclosure, movement of said latch lever toward and into latched position is by the application of manual force to said latch lever at said handle end to engage said latch member with said catch member and move said module, by force application thereto at said pivot means, to said fully inserted position in said enclosure;

j. a latch lever lock having a moving part on said handle end of said latch lever and a fixed part on said one side of said module, said moving part engaging said fixed part when said latch lever is in said latched position; and k. a manually operated lever attached to said moving part of said latch lever lock for displacing said moving part and disengaging said moving part from said stationary part to unlock said latch lever lock so that said latch lever may be moved.

5. The enclosure assembly according to claim 1, in which:

a. said pivot means comprises a snap-in pivot attachment for said latch lever.

6. The enclosure assembly according to claim 1, in which:

a. said modules are positioned one above the other in said enclosure and said latch lever moves angularly in a plane between adjacent modules.

7. An enclosure assembly, comprising:

a. an enclosure having opposite side walls and an open end;

b. a module insertable through said open end of said enclosure, said module having a front end and opposing sides wherein, when said module is fully inserted into said enclosure, said front end is positioned substantially at said open end of said enclosure and said sides are positioned within and extend along said walls of said enclosure, said module having a recess of predetermined depth in one surface thereof, the recess having a recess surface extending to said sides of said module at said front end of said module;

c. a latch lever operatively connected to the module, said latch lever being disposed between said walls of said enclosure at said front end of said module, said latch lever having a latch end and a handle end said latch lever having a predetermined thickness less than the depth of said recess and having an outer surface which is substantially flush with said one surface of said module;

d. pivot means mounted to said recess surface, pivotally engaging said latch lever between said latch end and said handle end, said latch lever being angularly movable in said recess about said pivot means between a latched position and an unlatched position;

e. said recess surface having an arcuate slot therethrough at a radius from said pivot means to a position near said handle end of said latch lever;

f. a slot follower mounted to said latch lever and projecting through said arcuate slot for preventing bending of said latch lever away from said recess surface;

g. a catch member on said enclosure;

h. a latch member on said latch end of said latch lever for engaging said catch member;

i. said latch member, when said latch lever is in said latched position, passing by said catch member as said module is moved toward said fully inserted position in said enclosure, movement of said latch lever toward and into latched position is by the application of manual force to said latch lever at said handle end to engage said latch member with said catch member and move said module, by force application thereto at said pivot means, to said fully inserted position in said enclosure;

j. a lip on a distal end of said latch lever at said handle end, said lip substantially paralleling the plane of rotation of said latch lever; and k. said arcuate slot receiving said lip of said latch lever for preventing displacement of said latch lever from the plane of rotation of said latch lever about said pivot means as said latch lever moves from said unlatched position into said latched position.

* * * * *